United States Patent [19]

Ikeda

[11] Patent Number: 5,285,351
[45] Date of Patent: Feb. 8, 1994

[54] COOLING STRUCTURE FOR INTEGRATED CIRCUITS
[75] Inventor: Hironobu Ikeda, Tokyo, Japan
[73] Assignee: NEC Corporation, Tokyo, Japan
[21] Appl. No.: 891,257
[22] Filed: Jun. 1, 1992
[30] Foreign Application Priority Data
May 30, 1991 [JP] Japan ................................. 3-155634
[51] Int. Cl.$^5$ .............................................. H05K 7/20
[52] U.S. Cl. ................................ 361/699; 165/104.33; 257/714
[58] Field of Search ................. 257/713, 714; 361/382, 361/385, 387; 174/15.1; 62/414; 165/104.33, 104.34, 80.4, 908, 185

[56] References Cited

U.S. PATENT DOCUMENTS

| | | | |
|---|---|---|---|
| 4,783,721 | 11/1988 | Yamamoto et al. | 361/382 |
| 4,791,983 | 12/1988 | Nicol | 165/80.4 |
| 4,977,444 | 12/1990 | Nakajima | 165/104.33 |
| 5,021,924 | 6/1991 | Kieda | 361/385 |
| 5,023,695 | 6/1991 | Umezawa et al. | 357/82 |
| 5,097,385 | 3/1992 | Chu | 165/80.4 |
| 5,168,348 | 12/1992 | Chu | 257/713 |

FOREIGN PATENT DOCUMENTS 60-160150 8/1985 Japan.

OTHER PUBLICATIONS

Oktay et al., "A conduction-cooled module for high-performance LSI devices", IBM J. Res. Develop., Jan. 1982, vol. 26, No. 1, pp. 55–66.

Primary Examiner—Gerald P. Tolin
Attorney, Agent, or Firm—Foley & Lardner

[57] ABSTRACT

A cooling structure cools integrated circuits (I.C.'s) by circulating a liquid coolant in the vicinity of the I.C.'s and causing the heat generated by the I.C.'s to be conducted to the liquid coolant. The cooling structure includes a wiring substrate, an I.C. mounted on the wiring substrate, storage means for a liquid coolant having an opening in its bottom and an inlet and an outlet for the liquid coolant at its top, adhering means for fastening together the bottom of the storage means and the heat radiating face of the I.C., and spraying means for directly spraying the liquid coolant on the heat radiating face of the I.C. through the opening.

9 Claims, 3 Drawing Sheets

COOLING STRUCTURE FOR INTEGRATED CIRCUITS

BACKGROUND OF THE INVENTION

The present invention relates to a cooling structure for integrated circuits (IC's), and more particularly to a cooling structure which cools IC's by circulating a liquid coolant, such as water, in the vicinity of the IC's and causing heat generated by the IC's to be conducted to the liquid coolant.

Examples of this kind of prior art cooling structure are disclosed in an article entitled "A Conduction-Cooled Module for High-Performance LSI Devices" by S. Oktay and H. C. Kammerer, published in IBM J. RES. DEVELOP, Vol. 26, No. 1, Jan. 1982 and Japanese Patent Application Disclosure No. Sho 60-160150.

The former article discloses a structure which causes heat generated by an IC on a wiring board to be conducted to a cold plate via a piston, a gap filled with helium gas, a hat and an interposer by pressing the piston, whose contact face is spherical, against a heat-radiating face of the IC with the pressure of a spring, and cooling the cold plate with a cooling medium.

The latter article teaches a structure which comprises a heat transfer substrate, a variable-shape heat conductor and a heat transfer plate arranged over heat radiating faces of chips on a printed wiring board together with a variable-elasticity bellows, and achieves cooling by spraying a liquid coolant from a nozzle over the heat transfer plate within the bellows.

These prior art cooling structures, however, have the following disadvantages:

First, regarding the cooling structure referred to first, the mechanism to constantly keep the piston pressed against the heat radiating face of the IC with the elastic force of the spring invites a load on the connecting part between the IC and the wiring board and thereby deteriorates the reliability of the connecting part.

Second, this cooling structure, in which the face of the piston coming into contact with the IC is spherically shaped and a gap is provided between the hat and the piston to absorb fluctuations in height and inclination which occur when the IC is fitted to the wiring board. However, the cooling efficiency is reduced by the limitation this configuration imposes on the effective heat transfer area.

Third, in the same cooling structure, the path of the coolant flow in the cold plate for heat transfer is formed by forced convection, resulting in a heat transfer coefficient of no more than 0.1 to 0.5 W/cm$^{2\circ}$ C., and accordingly the cooling capacity will prove to be insufficient if the power consumption rises with an increase in the degree of circuit integration.

Fourth, the cooling structure cited second, because of its configuration of the heat transfer substrate, with the variable-shape heat conductor and heat transfer plate intervening between the liquid coolant sprayed from the nozzle and the chips which are the sources of heat, is unable to attain a high enough heat conductivity, resulting in an insufficient cooling capacity.

SUMMARY OF THE INVENTION

An object of the invention, therefore, is to provide a cooling structure for IC's free from the above-mentioned disadvantages of the prior art structures.

According to an aspect of the invention, there is provided a cooling structure for an IC which comprises: a wiring substrate; an IC mounted on the wiring substrate; storage means for a liquid coolant, having an opening in its bottom and an inlet and an outlet for the liquid coolant at its top; adhering means for fastening together the bottom of the storage means and a heat radiating face of the IC; and spraying means for directly spraying the liquid coolant on the heat radiating face of the IC through the opening.

BRIEF DESCRIPTION OF THE DRAWINGS

The features and advantages of the present invention will become apparent from the following description when taken in conjunction with the accompanying drawings in which.

In the drawings, the same reference numerals represent the same structural elements.

DETAILED DESCRIPTION OF THE PREFERRED EMBODIMENTS

Description will first of be made prior art cooling structures for IC's, with a view to better understand the invention.

Figure 4:
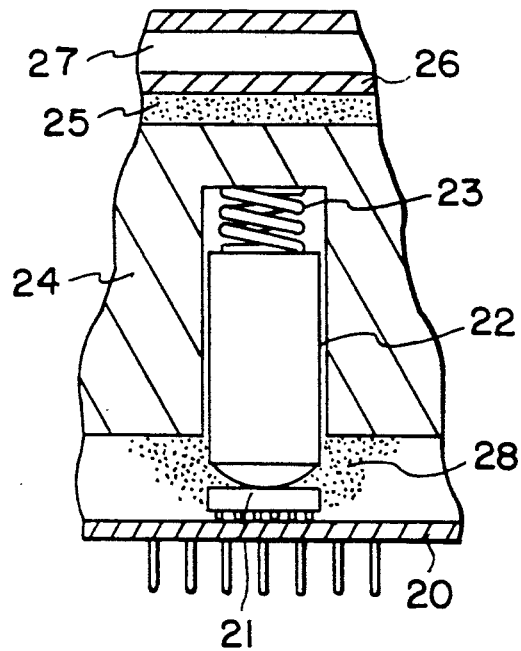
FIG. 4 shows a vertical cross-sectional view of a prior art cooling structure for IC's.

Referring to FIG. 4, a conventional cooling structure for IC's consists of a wiring board 20, an IC 21, a piston 22 in which part coming into contact with the IC is spherical, a spring 23, a hat 24, an interposer 25, a cold plate 26, a coolant 27 and helium gas 28.

The piston 22 is pressed against a heat radiating face of the IC 21 of elastic force by the spring 23. In this arrangement, the heat generating in the IC 21 is transmitted to the piston 22 which is in contact with the heat radiating face of the IC 21, and later to the hat 24 and the interposer 25 via a space filled with helium gas 28. Further, this heat is transmitted from the interposer 25 to the plate 26, and discharged into the coolant 27.

Figure 5:
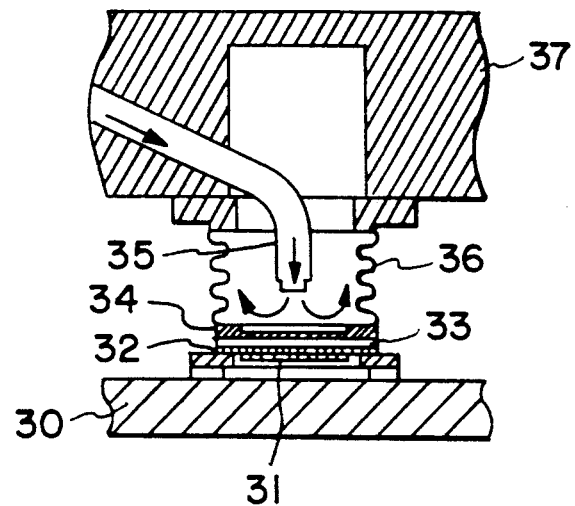
FIG. 5 shows a vertical cross-sectional view of another prior art cooling structure for IC's.

Referring now to FIG. 5, another conventional cooling structure for IC's consists of a printed wiring board 30, a chip 31, a heat transfer substrate 32, a variable-shape heat conductor 33, a heat transfer plate 34, a nozzle 35, a bellows 36 and a cooling header 37.

Heat generating in the chip 31 on the board 30 is transmitted via the substrate 32, the conductor 33 and the plate 34. In this arrangement, the plate 34 is deprived of its heat by spraying a liquid coolant from the nozzle 35 in the bellows 36, and the liquid coolant is discharged from the bellows 36 to a flow path in the header 37.

Next, description will be made in detail on preferred embodiments of the invention.

Figure 1:
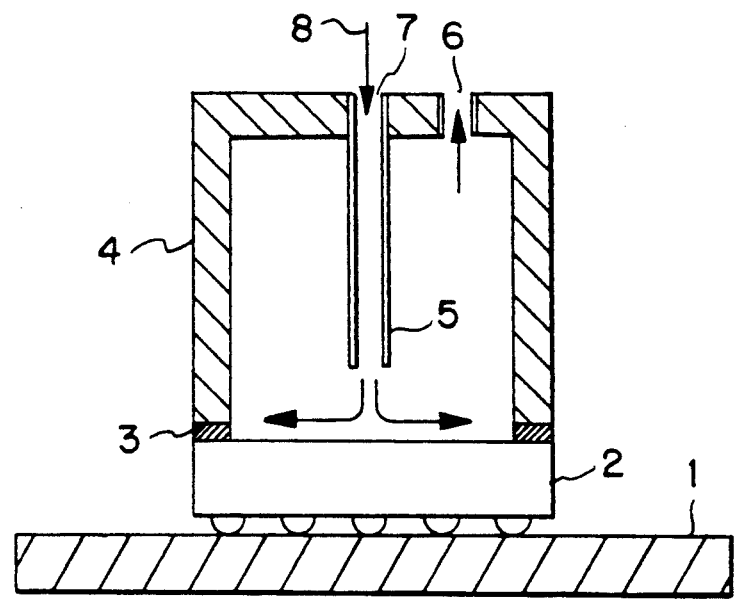
FIG. 1 shows a vertical cross-sectional view of a first embodiment of the invention.

Referring to FIG. 1, a first embodiment of the invention comprises a wiring substrate 1, an IC 2, a sealant 3, a nozzle 5, a cooling block 4 provided with a coolant outlet 6 and a coolant inlet 7, and a liquid coolant 8.

The cylindrical cooling block 4, having an opening in its bottom, is fastened with the sealant 3 to the IC 2 mounted on the substrate 1. The IC 2 here may be in the form of a chip carrier comprising a large-scale IC (LSI)

housed in a case or a flip chip in which an LSI is mounted barely without a case. The sealant 3 may be an epoxy-or silicon-based adhesive.

The block 4 is provided with the inlet 7 for letting the coolant 8 flow in, the nozzle 5 for spraying inside the coolant 8 having flowed in through the inlet 7, and the outlet 6 for discharging the coolant 8 having accumulated within. Therefore, since the coolant 8 having flowed in through the inlet 7 is directly sprayed by the nozzle 5 near the center of the heat radiating face of the IC 2, the IC 2 is directly cooled by the coolant 8 without any intervention of a heat transfer plate or anything else.

Since the connecting part between the IC 2 and the block 4 is tightly sealed by the sealant 3 in this arrangement, there is no possibility for the coolant 8 to leak over the substrate 1. Therefore, there is no particular need for the coolant 8 to be an insulator, but it may be an electrically non-insulative liquid coolant, such as water, and accordingly the coolant 8 can be selected solely for its cooling capability irrespective of its insulative ability.

As described above, according to the first embodiment, since the IC 2 mounted on the wiring substrate 1 is fastened with the sealant 3 to the bottom portion of the block 4 and the coolant 8 is directly sprayed by the nozzle 5 provided in the block 4 over the IC 2 without any intervention of a heat transfer plate or anything else, the thermal resistance from the PN junction of the IC 2 to the coolant 8 can be significantly reduced.

Figure 2:
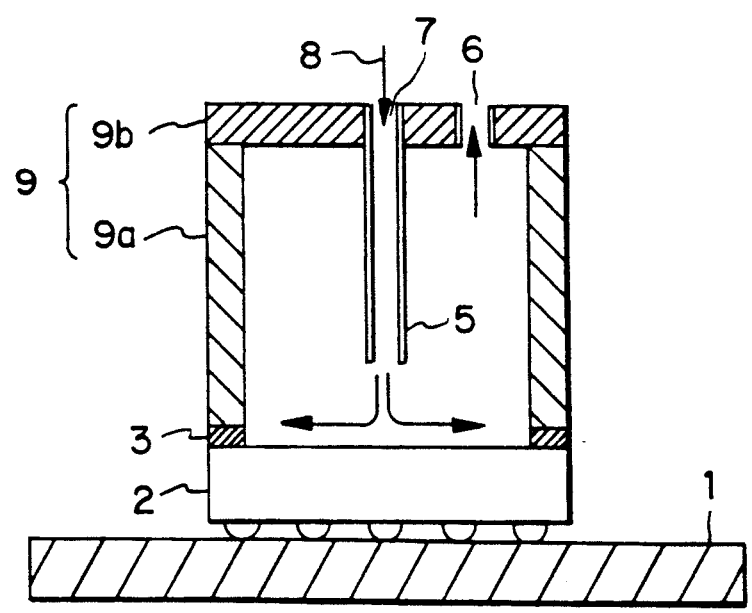
FIG. 2 shows a vertical cross-sectional view of a second embodiment of the invention.

Referring now to FIG. 2, a second embodiment of the invention comprises a wiring substrate 1; an IC 2; a sealant 3; a cooling block 9 which include a hollow cylinder 9a, a nozzle 5 fitted to the top face of the cylinder 9a, and a lid 9b having a coolant outlet 6 and a coolant inlet 7; and a liquid coolant 8.

In the embodiment, the lid 9b is provided with the inlet 7, the nozzle 5 and the outlet 6, and the lid 9b is fixed to the top face of the cylinder 9a either by brazing or with an adhesive. Therefore, since the coolant 8 is directly sprayed by the nozzle 5 near the center of a heat radiating face of the IC 2, the IC 2 is directly cooled by the coolant 8 without any intervention of a heat transfer plate or anything else.

As described above, according to the second embodiment, since the IC 2 mounted on the wiring substrate 1 is fastened with the sealant 3 to the bottom portion of the block 9 and the coolant 8 is directly sprayed by the nozzle 5 provided in the block 9 over the IC 2 without any intervention of a heat transfer plate or anything else, the thermal resistance from the PN junction of the IC 2 to the coolant 8 can be significantly reduced.

Figure 3:
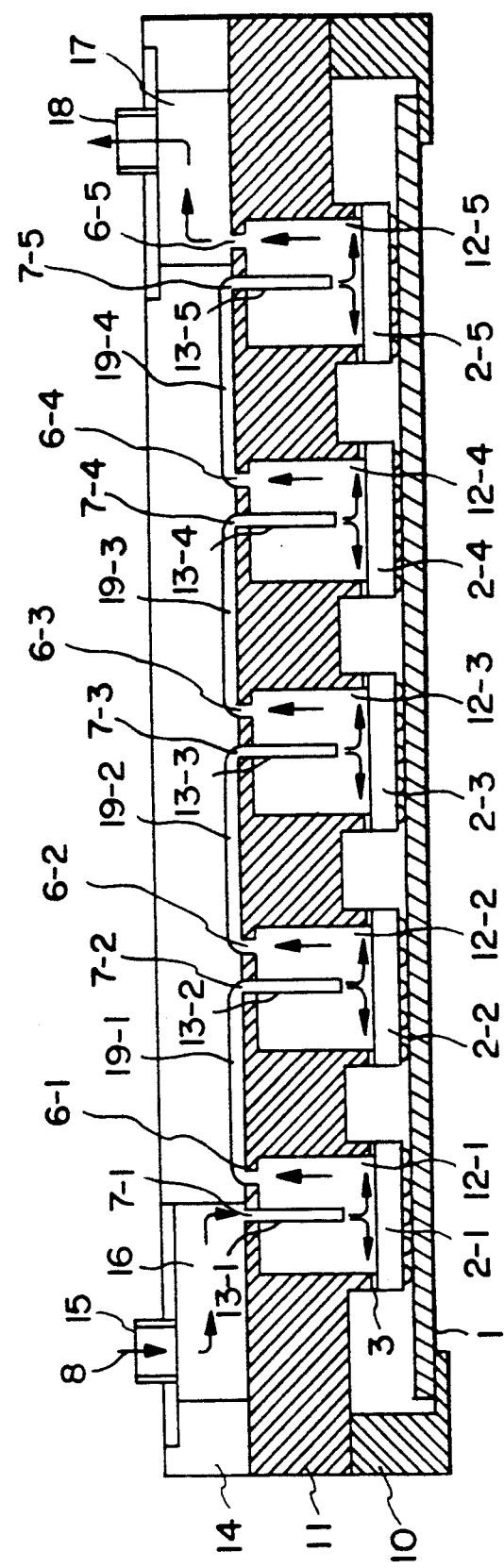
FIG. 3 shows a vertical cross-sectional view of a third embodiment of the invention.

Referring next to FIG. 3, a third embodiment of the invention comprises a wiring substrate 1; IC's 2-1 through 2-5; a sealant 3; a liquid coolant 8; a substrate frame 10; storage sections 12-1 through 12-5 for storing the coolant 8, each having an opening in its bottom; nozzles 13-1 through 13-5; a cooling block 11 having coolant outlets 6-1 through 6-5 and coolant inlets 7-1 through 7-5; a coolant entrance 15; a coolant inflow path 16; a coolant discharge path 17; a cooling exit 18; and a header 14 having facing grooves 19-1 through 19-4 for connecting the outlets 6-1 to 6-5 and the inlets 7-1 to 7-5 arranged in the block 11.

The IC's 2-1 through 2-5 are arranged and mounted on the substrate 1 in a matrix form. The frame 10 is fixed so as to surround the periphery of the substrate 1.

The block 11 is provided with the sections 12-1 through 12-5 in which is stored the coolant 8 in positions respectively corresponding to the IC's 2-1 through 2-5 mounted on the substrate 1. In the block 11, the openings of the sections 12-1 through 12-5 are positioned above the top faces of the IC's 2-1 through 2-5, and the sections 12-1 through 12-5 are fitted to the frame 10. The bottom portions of the block defining the openings of the sections 12-1 through 12-5 are fastened to the top faces of the IC's 2-1 through 2-5, respectively, and the sections 12-1 to 12-5 are sealed with the sealant 3. Further, the sections 12-1 through 12-5 of the block 11 are provided with the coolant inlets 7-1 through 7-5 and the coolant outlets 6-1 through 6-5, and the inlets 7-1 through 7-5 are contiguous with the nozzles 13-1 through 13-5, respectively, for spraying the coolant 8 near the centers of the heat radiating faces of the IC's 2-1 through 2-5.

The header 14, fitted to the upper side of the block 11, has the entrance 15, the inflow path 16, the path 17 and the exit 18. Thus, the liquid coolant flowing in through the entrance 15 is distributed among a plurality of flow channel lines by the path 16 arranged near the entrance 15, and the coolant 8 discharged from the plurality of flow channel lines, after being collected into the path 17 arranged near the exit 18, is discharged through the exit 18.

The header 14 is provided with the groove 19-1 for connecting the outlet 6-1 of the section 12-1 and the inlet 7-2 of the section 12-2, the groove 19-2 for connecting the outlet 6-2 of the section 12-2 and the inlet 7-3 of the section 12-3, the groove 19-3 for connecting the outlet 6-3 of the section 12-3 and the inlet 7-4 of the section 12-4, and the groove 19-4 for connecting the outlet 6-4 of the section 12-4 and the inlet 7-5 of the section 12-5.

The coolant 8 flowing in through the entrance 15 of the header 14 fills the path 16, then it is sprayed by the nozzle 13-1 toward the vicinity of the center of the heat radiating face of the IC 2-1, and finally it collides against the heat radiating face. The collided coolant 8, after filling the section 12-1, passes through the outlet 6-1 and the groove 19-1, then it is sprayed by the nozzle 13-2 toward the vicinity of the center of the heat radiating face of the IC 2-2, and finally it collides against that face.

The liquid coolant 8 having collided against the top face of the integrated circuit 2-2, similarly to the above, passes through the outlets 6-2, 6-3 and 6-4 and the grooves 19-2, 19-3 and 19-4, is sprayed by the nozzles 13-3, 13-4 and 13-5 toward the vicinity of the centers of the heat radiating faces of the IC's 2-3, 2-4 and 2-5, and collides against the respective faces.

The coolant 8 having collided against the top face of the IC 2-5, after filling the section 12-5 and being collected in the path 17 through the outlet 6-5, is discharged outside through the exit 18.

Therefore, heat generated in the IC's 2-1 through 2-5 is cooled by being transmitted to the coolant 8 which has been sprayed by the nozzles 13-1 through 13-5 over the top faces of the IC's 2-1 through 2-5 and colliding against the respective faces.

As described above, according to the third embodiment, it is possible to provide a cooling structure with little thermal resistance by fastening the frame 10 to the substrate 1 on which the plurality of the IC's 2-1 through 2-5 are mounted, fastening the top faces of the IC's 2-1 through 2-5 to the block 11 with the sealant 3, fitting the block 11 to the frame 10, and fitting on the block 11 the header 14, in which the flow channels are so formed as to let the nozzles 13-1 through 13-5 fitted to the block 11 directly spray the coolant 8 toward the vicinity of the centers of the heat radiating faces of the IC's 2-1 through 2-5, respectively.

In an experiment in which water was used as the coolant 8 and the speed of its spraying from the nozzles 5 and 13-1 through 13-5 was varied between 0.5 and 3.0 m/s, a heat conductivity of 1 to 3 w/cm$^2$° C. was obtained. Furthermore, since the openings of the blocks 4, 9 and 11 are fastened to the IC's 2 and 2-1 through 2-5 with the sealant 3 and the coolant 8 is brought into direct collision against the IC's 2 and 2-1 through 2-5, which are the sources of heat, to do away with the presence of not only air, which is poor in heat conductivity, but also any heat-conductive compound or metal in the heat transmission path, the thermal resistance from the PN junctions of the IC's 2 and 2-1 through 2-5 to the coolant 8 can be restrained to 0.5 to 1° C./w or even below.

Since the bottom portions of the cooling blocks 4, 9 and 11 are fastened to the IC's 2 and 2-1 through 2-5, respectively, and sealed with the sealant 3, there is no possibility for the coolant 8 to leak out of the flow channel over the substrate 1 or anywhere else. Therefore, an electrically non-insulative liquid coolant, such as water, can be used as coolant 8.

Although the blocks 4 and 9 have been described above as hollow cylinders, they may also be hollow rectangular parallelepipeds. Further, though the header 14 provided with the path 16, the path 17 and the grooves 19-1 through 19-4 is fitted on the cooling block 11 and the coolant channel is formed so as to mutually connect the sections 12-1 through 12-5 of the cooling block 11, independent coolant channels may also be formed to let the coolant 8 circulate separately in the sections 12-1 through 12-5.

The above-mentioned description has made it clear that, since the openings in the bottoms of the storage sections for storing the liquid coolant are fastened to the heat radiating faces of the IC's with the sealant and the nozzles provided in the cooling block directly spray the liquid coolant toward the vicinity of the centers of the heat radiating faces of the IC's, the thermal resistance from the IC's to the liquid coolant can be significantly reduced.

While the present invention has been described in conjunction with the preferred embodiments thereof, it will now be readily possible for those skilled in the art to put this invention into practice in various other manners.

What is claimed is:

1. A cooling structure for an integrated circuit comprising:
   a wiring substrate;
   an integrated circuit mounted on said wiring substrate;
   storage means for storing a liquid coolant, having an inlet and an outlet for said liquid coolant at the top thereof and an opening at the bottom thereof;
   adhering means fastening together said bottom of said storage means to a heat radiating face of said integrated circuit; and
   spraying means, in said storage means, for directly spraying said liquid coolant on said heat radiating face of said integrated circuit through said opening.

2. A cooling structure for an integrated circuit, comprising:
   a wiring substrate;
   an integrated circuit mounted on said wiring substrate;
   storage means for storing a liquid coolant, said storage means including a first member whose inside is hollow and a second member provided at the top of said first member, said second member having an inlet and an outlet for said liquid coolant;
   adhering means fastening together the bottom of said first member to a heat radiating face of said integrated circuit; and
   spraying means, in said storage means, for directly spraying said liquid coolant on said heat radiating face of said integrated circuit.

3. A cooling structure for integrated circuits, comprising:
   a wiring substrate;
   a plurality of integrated circuits mounted on said wiring substrate;
   a substrate frame holding said wiring substrate;
   a cooling block which includes a plurality of storage means for storing a liquid coolant, said cooling block having openings in the bottom portions thereof corresponding to the respective positions of said plurality of integrated circuits on said wiring substrate, and a plurality of spraying means, in said cooling block, for directly spraying said liquid coolant on heat radiating faces of said integrated circuits through said openings;
   a plurality of adhering means fastening together said heat radiating faces of said integrated circuits and the bottom of said cooling block; and
   a header arranged on the top face of said cooling block and provided with a coolant entrance for letting in said liquid coolant, a coolant exit for letting out said liquid coolant, a coolant inflow path for distributing said liquid coolant into a plurality of flow channels in the vicinity of said coolant entrance, a coolant discharge path for collecting said liquid coolant discharged from said plurality of flow channels in the vicinity of said coolant exit, and supply means for supplying said liquid coolant into said storage means in said cooling block.

4. The cooling structure of claim 1, wherein said adhering means is either an epoxy or a silicon-based adhesive.

5. The cooling structure of claim 1, wherein said liquid coolant is an electrically non-insulative liquid.

6. The cooling structure of claim 2, wherein said adhering means is either an epoxy or a silicon-based adhesive.

7. The cooling structure of claim 2, wherein said liquid coolant is an electrically non-insulative liquid.

8. The cooling structure of claim 3, wherein said adhering means is either an epoxy or a silicon-based adhesive.

9. The cooling structure of claim 3, wherein said liquid coolant is an electrically non-insulative liquid.

* * * * *